(12) United States Patent
Loh et al.

(10) Patent No.: US 8,542,545 B2
(45) Date of Patent: Sep. 24, 2013

(54) REPAIRING SOFT FAILURES IN MEMORY CELLS IN SRAM ARRAYS

(75) Inventors: Wah Kit Loh, Richardson, TX (US); Beena Pious, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 244 days.

(21) Appl. No.: 13/070,799

(22) Filed: Mar. 24, 2011

(65) Prior Publication Data
US 2012/0243354 A1   Sep. 27, 2012

(51) Int. Cl.
*G11C 29/00* (2006.01)

(52) U.S. Cl.
USPC ............ 365/200; 365/201; 365/154; 365/156

(58) Field of Classification Search
USPC .................................. 365/200, 201, 154, 156
See application file for complete search history.

(56) References Cited

U.S. PATENT DOCUMENTS 7,324,391 B2 *   1/2008   Loh et al. ...................... 365/201

* cited by examiner

*Primary Examiner* — Toan Le
(74) *Attorney, Agent, or Firm* — John R. Pessetto; Wade J. Brady, III; Frederick J. Telecky, Jr.

(57) ABSTRACT

An embodiment of the invention provides a method of repairing soft failures in memory cells of an SRAM array. The SRAM array is tested to determine the location and type of soft failures in the memory cells. An assist circuit is activated that changes a voltage in a group of memory cells with the same type of soft failure. The change in voltage created by the assist circuit repairs the soft failures in the group. The group may be a word line or a bit line. The type of soft failures includes a failure during a read of a memory cell and a failure during the write of a memory cell.

20 Claims, 7 Drawing Sheets

REPAIRING SOFT FAILURES IN MEMORY CELLS IN SRAM ARRAYS

BACKGROUND

SRAM (Static Random Access Memory) is often integrated as part of a microprocessor IC (integrated circuit), a DSP (digital signal processor) IC or other SOCs (System on a Chip). In addition, SRAM may be fabricated as a stand-alone IC. Individual memory cells (bits) on an SRAM may fail for a variety of reasons. For example, a memory cell may fail to due to a "hard" failure. Hard failures may be caused by physical defects such as metal shorting two electrical nodes together or a void in a metal connection for example.

An individual memory may also fail due to a "soft" failure. Usually, a soft failure will occur in a memory cell of an SRAM due to voltage conditions applied during read and write cycles. These voltage conditions at the memory arrays may be due to variations in the supply voltage and variations in process parameters for example. These variations in process parameters include variation of threshold voltages (Vt) and variation in leakage current for example. Variation in Vt, for example, may occur due to fluctuations in the doping of a transistor or the effective length of a transistor.

Hard and soft memory cell failures may be fixed using redundant memory cells that are added to an IC specifically to replace memory cells that fail. Adding redundant memory cells however requires more area to be used on an IC. Increasing the size of an IC usually increases the cost of the IC. As a result, the amount of redundancy used to repair memory cell failures is kept as small as possible. While memory cell failures caused by hard failure usually need to be corrected using redundant bits, memory cell failures caused by soft failure may be corrected without using redundant memory cells.

When a memory cell failure occurs due to a soft failure, circuit techniques or "assists" may be used to correct the memory cell failures. These techniques usually increase or decrease a voltage applied to an individual memory cell. For example, boosting (increasing) the voltage on a word line during a write cycle can improve the write margin of an SRAM memory cell. Lowering the voltage on a bit line below VSS during a write cycle can also improve the ability to write to an SRAM memory cell. These and other circuit techniques will be explained in more detail in the specification that follows.

By first identifying soft (memory cell) failures in an SRAM and then fixing the soft (memory cell) failures using circuits assists, the amount of redundancy required on an SRAM may be reduced and as a result lower the cost of an IC.

DETAILED DESCRIPTION

The drawings and description, in general, disclose a method and system for repairing soft failures in memory cells of an SRAM array. In one embodiment, an SRAM array is tested to determine the locations of the memory cells with the soft failures. In addition, the SRAM array is tested to determine the type of soft failures. The type of failures includes a failure that occurs during a read of the memory cell or during the write of a memory cell. After the location and type of soft failures are determined, an assist circuit is activated that changes a voltage in the memory cells of a group of memory cells with one type of soft failure.

The change in voltage created by the assist circuit repairs the soft failures in the group. The group may be as small as a word line or a bit line, for example. The type of soft failures includes a failure during a read of a memory cell and a failure during the write of a memory cell, for example.

Figure 1:
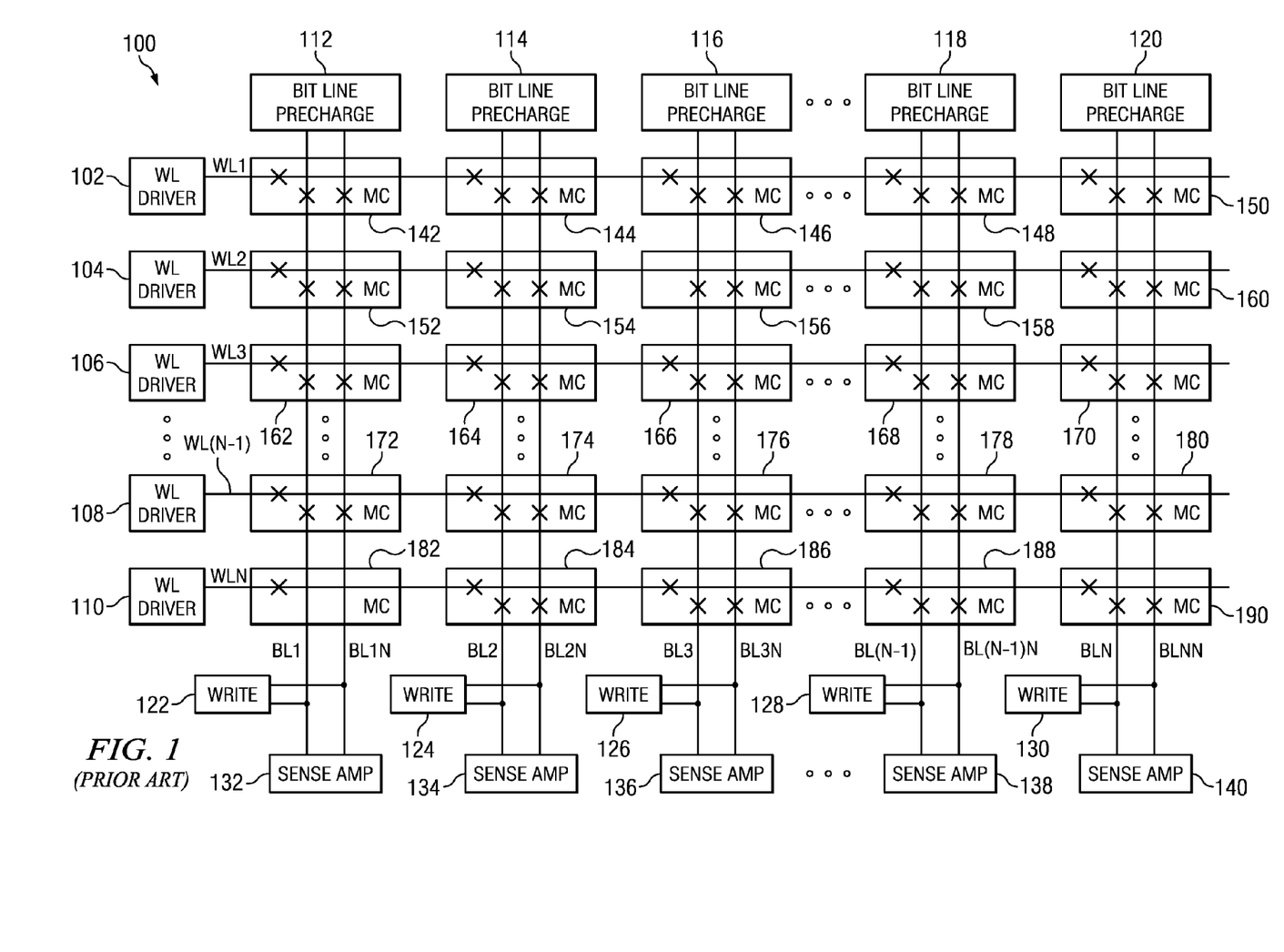
FIG. 1 is a block diagram of an embodiment of an SRAM array. (Prior Art)

FIG. 1 is a block diagram of an embodiment of an SRAM array. In this embodiment, there are N WL (word line) drivers, 102-110, that drive WLs (word lines), WL1-WLN. The N WL drivers, 102-110 are connected to N×N memory cells (MC) (bits), 142-190. The number of memory cells connected to a word line is dependent, for example, on how fast the memory cells would like to be accessed. For example, there may be 128 memory cells on a word line. Bit line pre-charge circuits 112-120 charge bit line pairs, (BL1 & BL1N)-(BLN & BLNN), respectively before a memory cell is read or written. The number of memory cells connected to a pair of bit lines is also dependent on how fast the memory cells would like to be accessed. For example, there may be 256 memory cells connected to a bit-line pair. FIG. 1 also illustrates how SAs (sense amps), 132-140, and write circuits 122-130 are connected to the bit lines pairs, (BL1 & BL1N)-(BLN & BLNN).

When data from a group of memory cells, for example a word line, is read, WL2 may be driven to a logical high value. After WL2 is driven to a logical high value, one or more bit-line pairs are selected. For example, bit-line pairs, (BL2 & BL2N) and (BL3 & BL3N) may be selected. In this example, when bit-line pairs, (BL2 & BL2N) and (BL3 & BL3N) are selected, sense amps 134 and 136 amplify the voltages provided by bit-line pairs, (BL2 & BL2N) and (BL3 & BL3N). After the voltages are amplified, the data may be sent to another part of an SRAM and then output from the SRAM.

When data from a group of memory cells belonging to a word line is written, for example WL3, WL3 may be driven to a logical high value. After WL3 is driven to a logical high value, one or more bit-line pairs are selected. For example, bit-line pairs, (BL1 & BL1N) and (BL2 & BL2N) may be selected. In this example, when bit-line pairs, (BL1 & BL1N)

and (BL2 & B23N) are selected, write circuits 122 and 124 drive the bit-lines, (BL1 & BL1N) and (BL2 & BL2N) respectively to a specific voltage. After the selected memory cells 162 and 164 in this example have been written to, WL3 is driven to a low logical value.

Figure 2:
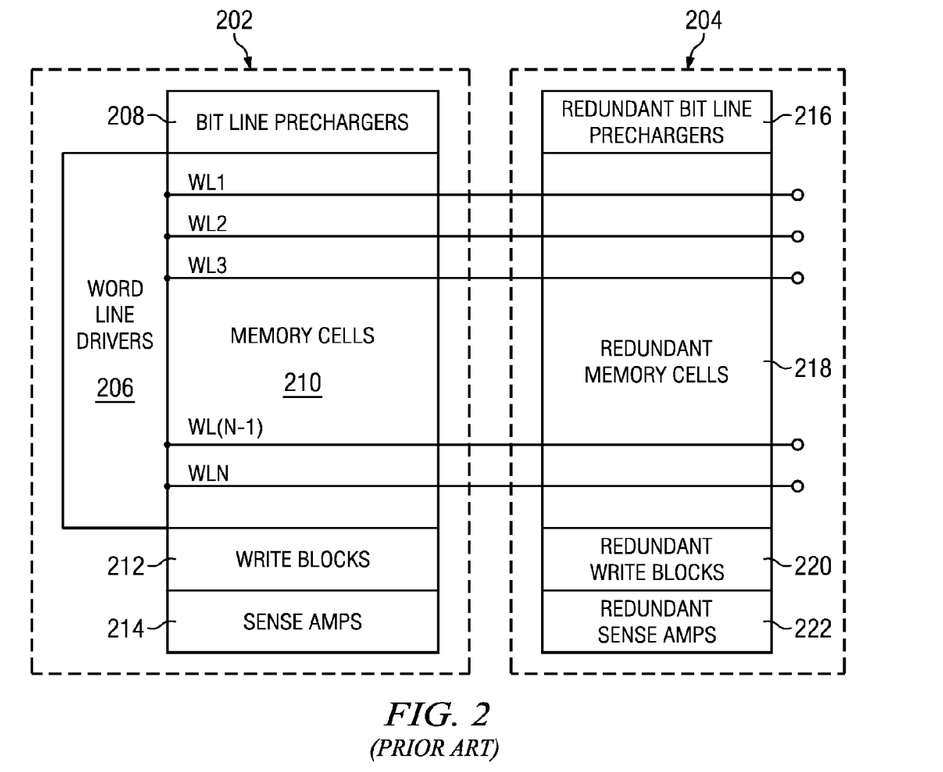
FIG. 2 is a block diagram of an embodiment of an SRAM array and a redundant SRAM array. (Prior Art)

FIG. 2 is a block diagram of an embodiment of an SRAM array 202 and a redundant SRAM array 204. In this embodiment, an SRAM array 202 has N×N memory cells 210. A bit-line precharger block 208 includes N bit-line precharger circuits. Each bit-line pre-charger charges a bit-line pair before reading or writing data from a memory cell. A word-line driver block 206 includes N word-line driver circuits. Each word-line driver circuit drives a word line including N SRAM memory cells and P redundant memory cells. In this embodiment, a write block 212 includes N write circuits. Each write circuit drives a bit-line pair to write data into a memory cell. In this example, each bit-line pair includes N memory cells. A sense amp block 214 includes N sense amps. Each sense amp amplifies a voltage provided to the sense amp by a bit line pair when the memory cell is read.

In this example, when one or more defects are found in the SRAM array 202, a redundant array 204 having P×N memory cells 218 may be substituted for a group of P×N memory cells within the SRAM array 202. In this embodiment, N is greater than P, where P and N are integer values. The redundant array 218 has a bit-line precharger block 216 that includes P bit-line precharger circuits. Each bit-line pre-charger charges a bit-line pair before reading or writing data from a memory cell. In this example, memory cells 218 in the redundant memory array are connected to the word-lines, WL1-WLN of the SRAM array 210. Each word-line driver circuit drives a word line including N SRAM memory cells and P redundant SRAM memory cells. In this embodiment, a redundant write block 220 includes P write circuits. Each redundant write circuit drives a bit-line pair to write data into a memory cell. In this example, each bit-line pair includes N memory cells. A sense amp block 222 includes P sense amps. Each sense amp amplifies a voltage provided to the sense amp by a bit line pair when a redundant memory cell is read.

Figure 3:
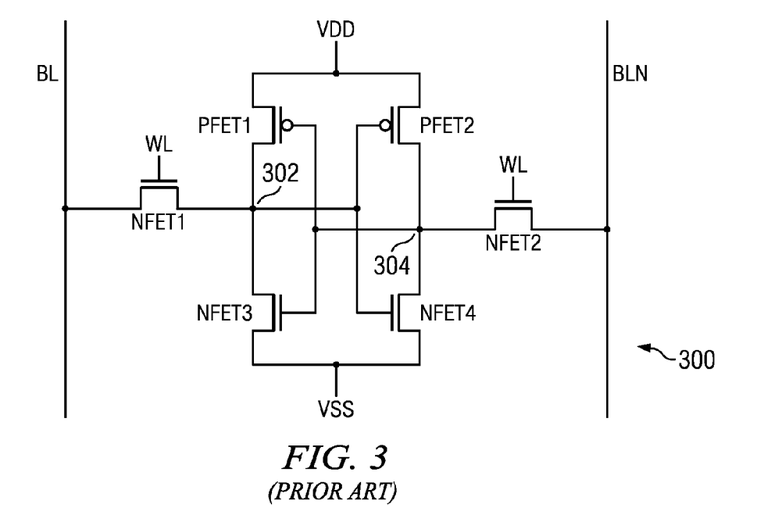
FIG. 3 is a schematic diagram of an embodiment of an SRAM memory cell (bit). (Prior Art)

FIG. 3 is a schematic diagram of an embodiment of an SRAM memory cell (bit) 300. In this example of an SRAM memory cell, PFETs (P-type Field-Effect Transistor) and NFETs (N-type Field-Effect Transistor) are used. In this embodiment, NFET1 and NFET2 are used as pass (transfer) gates. The drain of NFET1 is connected to bit-line BL, the gate of NFET1 is connected to the word-line WL and the source of NFET1 is connected to node 302. The drain of NFET2 is connected to bit-line BLN, the gate of NFET2 is connected to the word-line WL and the source of NFET2 is connected to node 304. The drain of NFET3 is connected to node 302, the gate of NFET3 is connected to node 304 and the source of NFET3 is connected to VSS. The drain of NFET4 is connected to node 304, the gate of NFET4 is connected to node 302 and the source of NFET4 is connected to VSS. The drain of PFET1 is connected to node 302, the gate of PFET1 is connected to node 304 and the source of PFET1 is connected to VDD. The drain of PFET2 is connected to node 304, the gate of PFET2 is connected to node 302 and the source of PFET2 is connected to VDD.

During a write cycle when a logical one is being written, node 304 must be pulled to a low voltage through NFET2. If node 304 cannot be discharged below the trip point of PFET1 and NFET3 while the word line WL is high, a logical one will fail to be written to the memory cell 300. The voltage of VDD and the Vts of the MOSFETs in the memory cell 300 affect the trip point of the memory cell 300 and the value of the voltage on node 304 during a write. For example, a logical one may be able to be written to memory cell 300 when VDD is approximately one volt and the average Vt of the MOSFETs in the memory cell 300 is approximately 400 mv. However, if the voltage of VDD is lowered to 0.7 and the average Vt of the MOSFETS remain 400 mv, a logical one cannot be written into the memory cell. This condition is a soft failure. The memory cell 300 in this example will also have a soft failure when the voltage of VDD is 1.0 and the average Vt value is 0.7 volts.

In an embodiment of the invention, a soft failure that occurs during an attempted write to an SRAM memory cell may be corrected by increasing the voltage on a word line WL from what it was previously. For example, during a write cycle, the voltage on word line WL may be increased from 1.0 to 1.2. Increasing the voltage on the word line WL increases the drive on pass gate NFET2 and as a result improves the trip point of the memory cell 300. In this embodiment, only word lines that have the type of soft failure that occurs during an attempted write to an SRAM memory cell 300 will be boosted to a higher voltage. Boosting the word lines of cells that don't have this type of soft failure, may cause otherwise stable memory cells to fail. The voltage on word line may be boosted by selecting a part of a word line drive which provides a higher voltage. The selection may be made by blowing fuses, by electrical selection or other methods known in the art.

Figure 4:
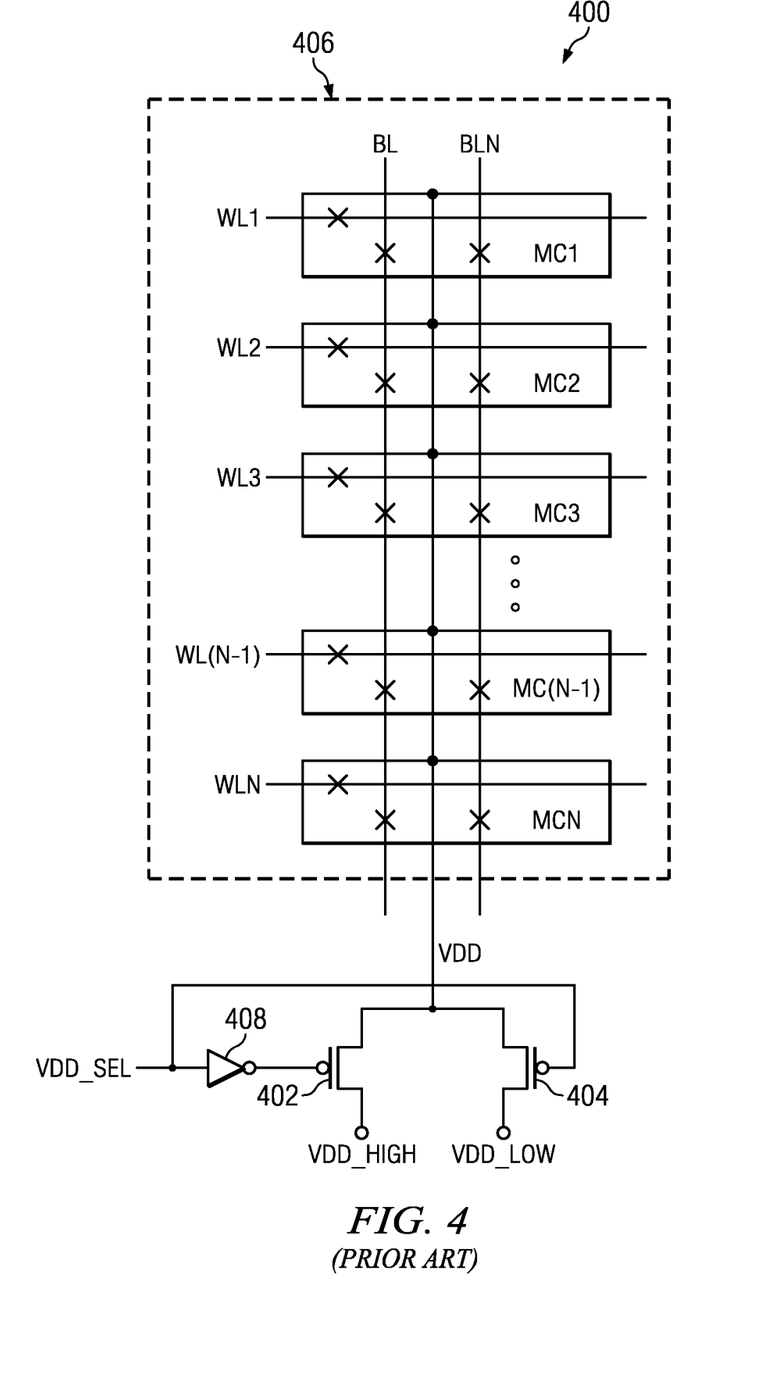
FIG. 4 is a schematic diagram of an embodiment of a method for lowering the voltage VDD on a column of memory cells during a write cycle. (Prior Art)

In an other embodiment of the invention, a soft failure that occurs during an attempted write to an SRAM memory cell may be corrected by decreasing the voltage of VDD supplied to a column of memory cells relative to a voltage on a word line WL. FIG. 4 is a block diagram of an embodiment of a method for lowering the voltage VDD on a column of memory cells during a write cycle. During a write cycle, the gate of PFET 404 is driven to a logical low value and the gate of PFET 402 is driven to a logical high value. Because the gate of PFET 404 is driven to a logical low value, PFET 404 is activated and applies a lower voltage, VDD_LOW to VDD. VDD is the positive voltage supplied to the memory cells, MC1-MCN, in the column 406 shown in FIG. 4. Because the gate of PFET 402 is driven to a logical high value, PFET 404 is inactivated and the higher voltage, VDD_HIGH is not applied to VDD.

Decreasing the voltage VDD applied to a column 406 of memory cells MC1-MCN relative to the voltage of the word lines WL1-WLN decreases the gate drive of PFET1 relative to pass gate NFET2 (FIG. 3). As a result, the trip point of the memory cells MC1-MCN is improved. In this embodiment, only columns of memory that have the soft failure that occurs during an attempted write to an SRAM memory cell will have the voltage VDD lowered with respect to word lines WL1-WLN. Lowering the voltage VDD of columns of memory that don't have this type of soft failure, may cause otherwise stable memory cells to fail.

Figure 5:
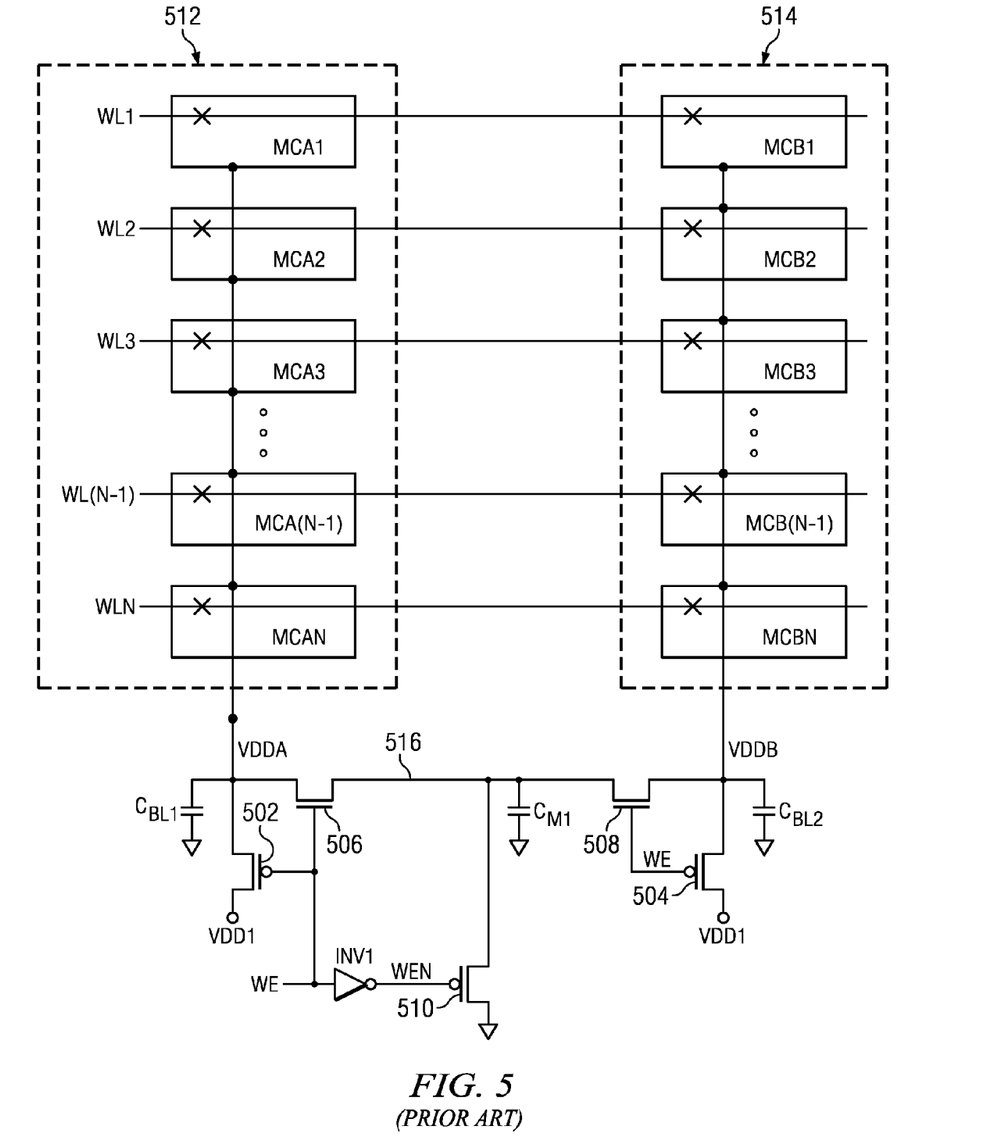
FIG. 5 is a schematic diagram of an embodiment of a method for lowering the voltage VDD on a column of memory cells during a write cycle using a capacitive charge sharing scheme. (Prior Art)

Methods other than the method shown in FIG. 4 may be used to decrease the voltage VDD applied to a column of memory cells MC1-MCN relative to the voltage of the word lines WL1-WLN. For example, voltage VDD of a column of memory cells may be lowered below the word line WL level through a charge-sharing scheme as shown in FIG. 5. In the example shown in FIG. 5, when WE (write enable) is low, nodes VDDA and VDDB are charged to voltage VDD1 through PFETS 502 and 504 respectively. Also when WE is low, the gate of NFET 510 is driven high turning on NFET 510. During this time NFET 510 discharges the capacitance CM1 on node 516 towards ground.

WE is driven to a high logical value when the memory cells MCA1-MCAN and MCB1-BCBN in columns 512 and 514 respectively are being written. When WE is high PFETs 502 and 504 as well as NFET 510 are turned off. NFETs 506 and 508 are turned on when WE is high. When NFETs 506 and 508 are turned on, capacitive coupling occurs between Cbl1, Cbl2 and Cm1. After the capacitive coupling occurs, the voltage on nodes VDDA and VDDB are lowered while the voltage on node 516 is raised. Since node VDDA and VDDB supply the positive voltage to the memory cells in columns 512 and 514 respectively, the positive voltage to these memory cells is lowered with respect to the word lines WL1-WLN. In this embodiment, only columns of memory that have the soft failure that occurs during an attempted write to an SRAM memory cell will have the voltage VDD lowered with respect to word lines WL1-WLN. Lowering the voltage VDD of columns of memory that don't have this type of soft failure, may cause otherwise stable memory cells to fail.

Figure 6:
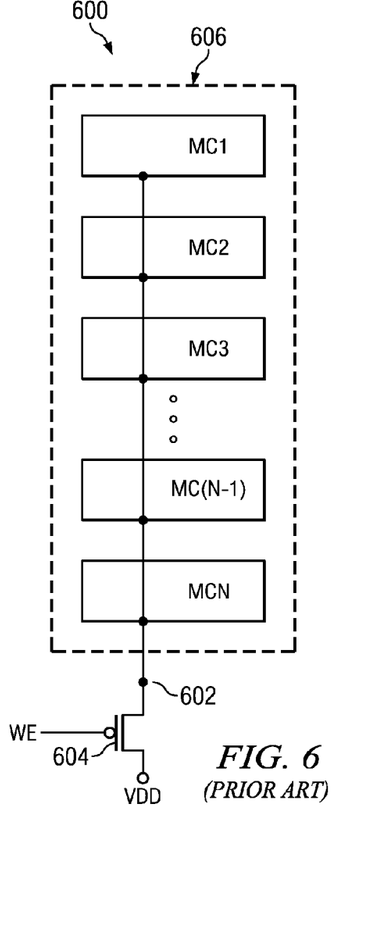
FIG. 6 is a schematic diagram of an embodiment of a method for lowering the voltage VDD on a column of memory cells during a write cycle by floating VDD during a write. (Prior Art)

FIG. 6 illustrates an other embodiment of a method of lowering the voltage VDD applied to a column of memory cells relative to the voltage of the word lines. In this example, when the memory cells are being written, signal WE is a logical high value and PFET 604 is inactivate. Because PFET 604 is inactive the node 602 floats. Node 602 supplies the positive voltage to the memory cells MC1-MCN. Because node 602 is floating during a write cycle, the voltage on node 602 is pulled below the value of the voltage on VDD due to the write current in a memory cell.

Decreasing the voltage VDD applied to a column 606 of memory cells MC1-MCN relative to the voltage of the word lines (not shown) decreases the gate drive of PFET2 (FIG. 3) relative to pass gate NFET2 (FIG. 3). As a result, the trip point of the memory cells MC1-MCN is improved. In this embodiment, only columns of memory that have the soft failure that occurs during an attempted write of an SRAM memory cell will have the voltage VDD lowered with respect to word lines. Lowering the voltage VDD of columns of memory that don't have this type of soft failure, may cause otherwise stable memory cells to fail.

Figure 7:
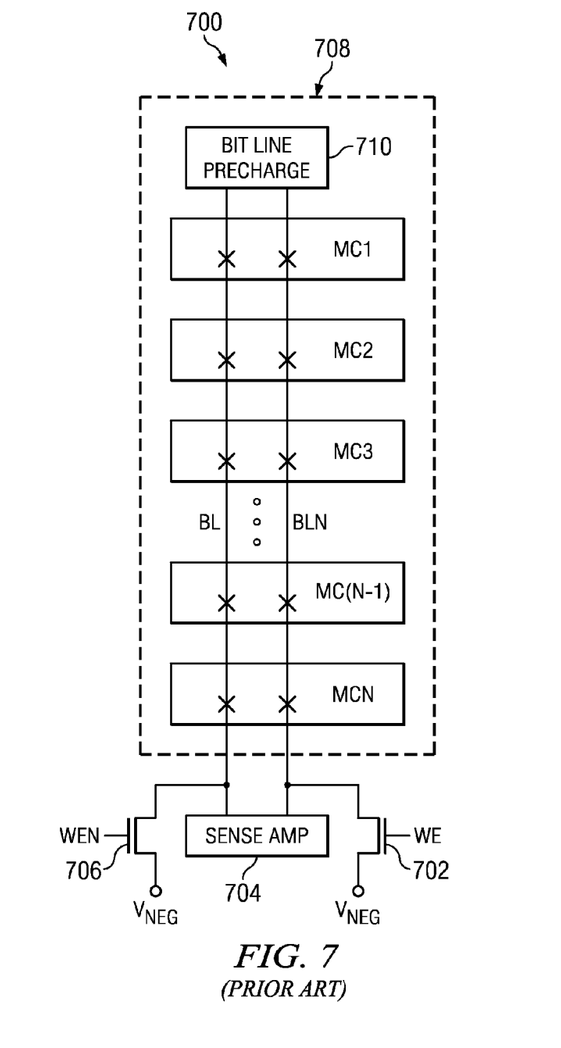
FIG. 7 is a schematic diagram of an embodiment of a method for lowering a bit line below VSS during a write. (Prior Art)

FIG. 7 is a schematic diagram of an embodiment of a method for lowering a bit line below VSS (FIG. 3) during a write. In this example, when the memory cells MC1-MCN are being written, the low bit line BLN in the bit line pair BL and BLN is driven below VSS of the memory cells MC1-MCN. In FIG. 7 when the column 708 is being written, WE is a logic high value. Since the gate of NFET 702 is a high logical value, NFET 702 is activated and bit line BLN is connected to Vneg. In this example, Vneg is a voltage below the VSS value used for memory cells MC1-MCN.

When bit line BLN is pulled below VSS of the memory cells, the gate drive of NFET2 shown in FIG. 3 will increase relative to the pull up device PFET2 shown in FIG. 3. As a result, the ability to write to a memory cell will be improved during a write. In this embodiment, only columns of memory that have the soft failure that occurs during an attempted write of a logical one to an SRAM memory cell will have the voltage VDD lowered with respect to word lines. Lowering the voltage of a bit line below VSS of a memory cell in columns of memory cells that don't have this type of soft failure, may cause otherwise stable memory cells to fail.

During a read cycle when a logical zero is being read, word line WL (FIG. 3) is driven to a logical high value. Driving WL to a logical high value turns on pass gate NFET1 (FIG. 3). When pass gate NFET1 turns on, node 302 will rise due to the resistive divider created by NFET1 and NFET3 being in series. When the voltage level on node 302 is higher than the trip point of PFET2 and NFET4, the memory cell will loose its state (i.e. the memory cell will flip from a zero logical state to a one logical state). When a memory cell looses its state, it is often called a "disturb" because the correct data has been disturbed. This condition is a soft failure.

Change in the voltage of VDD and change in the Vts of the MOSFETs in the memory cell 300 affects the trip point of the memory cell 300 and the value of the voltage on node 302 during a read. By controlling changes in the voltage on VDD and word lines, a memory cell 300 that failed during a read due to a soft failure may be corrected. Examples of how soft failures that occur during a read may be corrected by controlling changes in the voltage on VDD and word lines, for example, are explained below.

Figure 8:
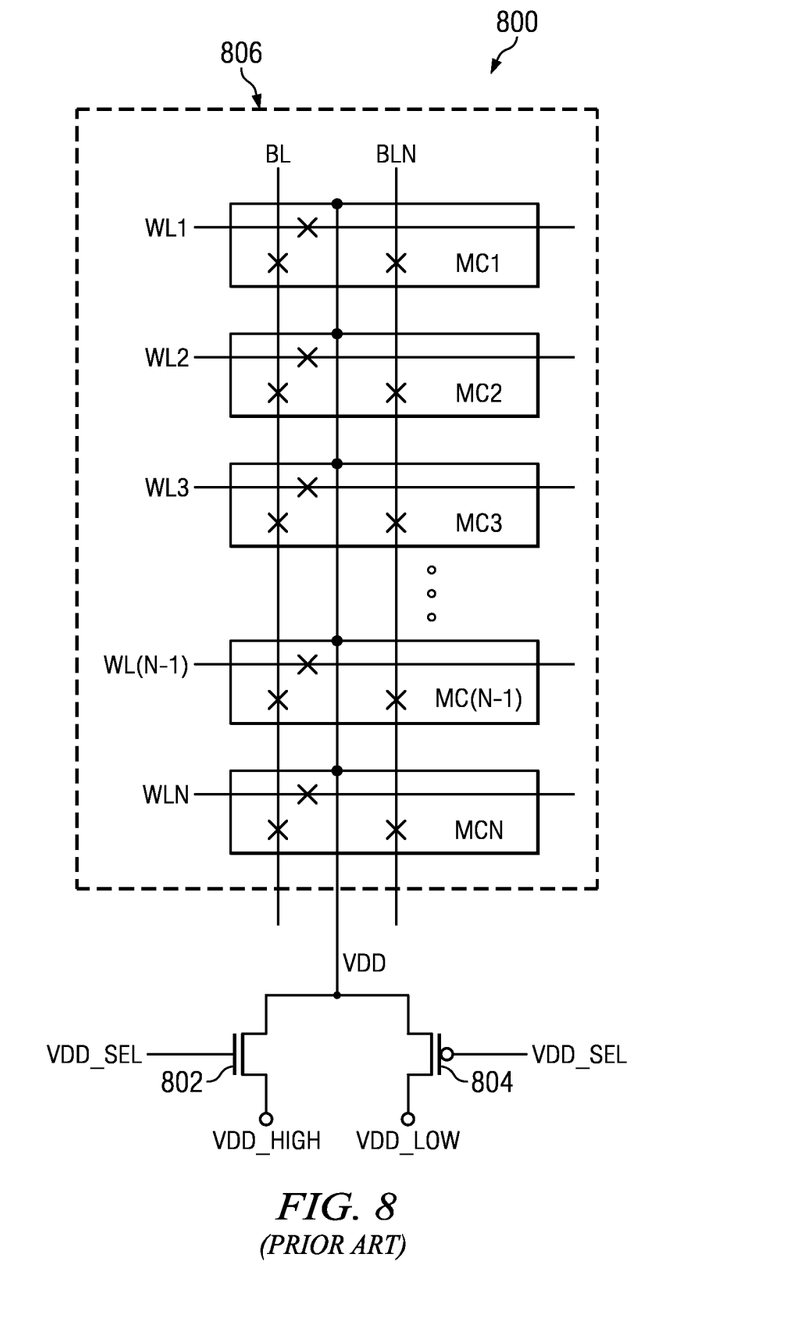
FIG. 8 is a schematic diagram of an embodiment of a method for raising the voltage of VDD above the voltage on a word line during a read. (Prior Art)

FIG. 8 is a schematic diagram of an embodiment of a method for raising the voltage of VDD above the voltage on a word line during a read. During a read cycle, the gate of PFET 802 is driven to a logical low value and the gate of PFET 804 is driven to a logical high value. Because the gate of PFET 802 is driven to a logical low value, PFET 802 is activated and applies a higher voltage, VDD_HIGH to VDD. VDD is the positive voltage supplied to the memory cells, MC1-MCN, in the column 806 shown in FIG. 8. Because the gate of PFET 804 is driven to a logical high value, PFET 804 is inactivated and the lower voltage, VDD_LOW is not applied to VDD.

Increasing the voltage VDD applied to a column 806 of memory cells MC1-MCN relative to the voltage of the word lines WL1-WLN increases the gate drive of pass gate NFET1 relative to pass gate NFET3 (shown in FIG. 3). As a result, the trip point of the memory cells MC1-MCN is improved. In this embodiment, only columns of memory that have the soft failure that occurs during an attempted read of an SRAM memory cell will have the voltage VDD raised with respect to word lines WL1-WLN. Raising the voltage VDD of columns of memory that don't have this type of soft failure will cause power to increase unnecessarily.

In an embodiment of the invention, a soft failure that occurs during an attempted read from an SRAM memory cell may be corrected by decreasing the voltage on a word line WL with respect to the voltage VDD. In this embodiment, only word lines that have the type of soft failure that occurs during an attempted read from an SRAM memory cell 300 will have their voltage lowered. Lowering the voltage on word lines of cells that don't have this type of soft failure will cause read current on those cells to unnecessarily degrade. The voltage on word line may be lowered by selecting a part of a word line driver (FIG. 1), for example 112, which provides a lower voltage. The selection may be made by blowing fuses, by electrical selection or other methods know in the art.

As described above, soft failures in an SRAM memory array may result from failure to successfully write to a memory cell or they may result from memory cells being disturbed during a read cycle. Due to global Vt variations that occur across a wafer, from wafer to wafer and from lot to lot, it wasn't unusual in earlier technology for SRAM memory arrays to have Vt variations in a range to have only write soft failures or only read soft failures, but not both. When this was the case, a limited number of circuit techniques were needed to correct soft failures.

However, with more advanced semiconductor processes that have smaller transistor gate widths and lengths, local variations in Vt dominate. Because local variations in Vt dominate, there is an increasing probability that both write and read soft failures will occur in a single SRAM array. As a result, all of the circuit techniques describe above may be used to fix soft failures in a single SRAM array. It is not likely, however, that the variation in Vt would be large on an individual word line or an individual bit line pair. Therefore, using a circuit technique to change a voltage level on a single word line or a single bit line pair can fix more than one soft failure when more than one soft failure occurs on a single word line or a single bit line pair.

The circuit techniques described previously are examples of how voltages may be controlled to fix soft failures in an SRAM array. The description of these techniques is not meant to be exhaustive. It is anticipated that other circuit techniques may be used as well.

Figure 9:
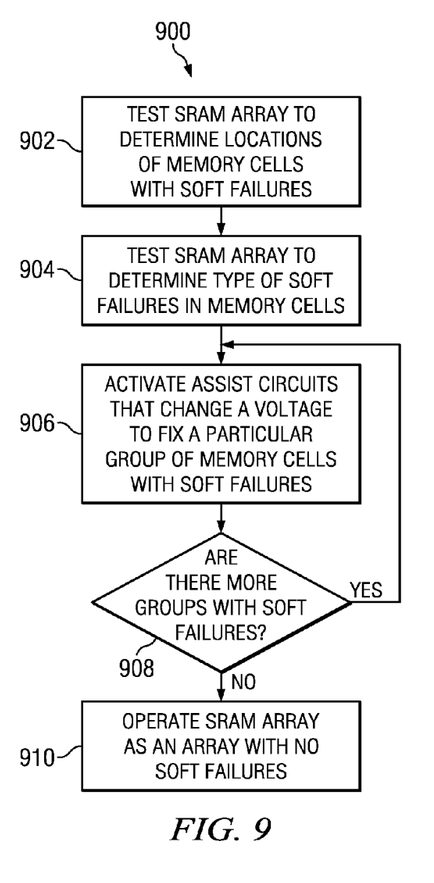
FIG. 9 is a flow chart illustrating an embodiment of a method for repairing soft failures in an SRAM array using selective circuit techniques.

FIG. 9 is a flow chart illustrating an embodiment of a method for repairing soft failures in an SRAM array using selective circuit techniques (assists). During step 902, an SRAM array is tested to determine locations of memory cells with soft failures. The SRAM array may be contained in a stand-alone SRAM or in an SRAM that is part of an SOC, a DSP, or a processor. After the locations of the soft failures are determined, the type of SRAM soft failure is determined in step 904. The type of SRAM soft failure may be a failure that occurs during a write of a memory cell or during the read of a memory cell for example.

After the type of SRAM soft failure has been determined, one or more assist circuits may be activated that change a voltage in the memory cells with the soft failures, step 906. The voltage is changed for a group of memory cells. For example, the group of memory cells may be a group of memory cells that are contained on an individual word line or an individual bit line pair. A voltage is changed with respect to another voltage. For example, the voltage on an individual word line may increase or decrease with respect to the positive power supply voltage VDD in a memory cell.

After an assist circuit has been activated to fix a particular group of soft failures, it is determined in step 908 whether there are more groups with soft failures. When there are more groups with soft failures, step 906 is repeated and another assist circuit is activated. However, when there are no longer groups with soft failures, the SRAM array may be operated as a functional SRAM array.

Figure 10:
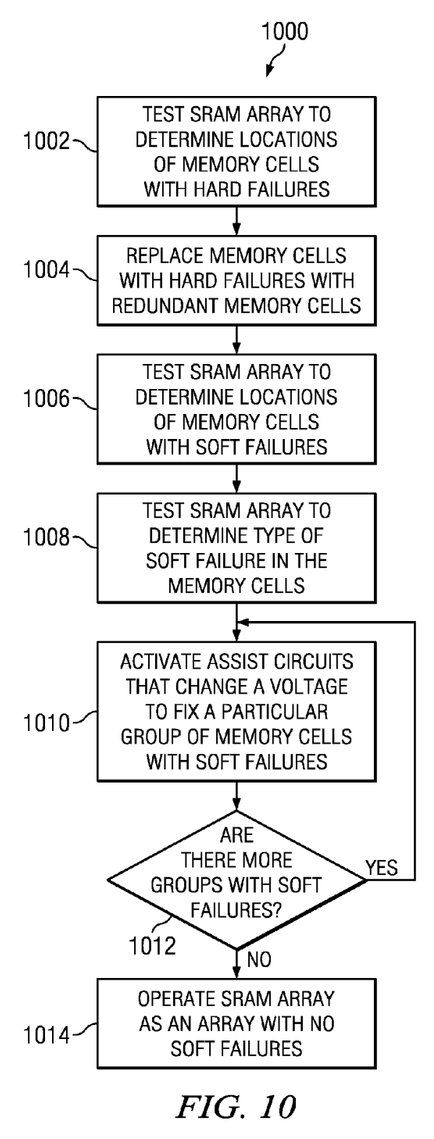
FIG. 10 is a flow chart illustrating an embodiment of a method for repairing hard and soft failures in an SRAM array using selective circuit techniques.

FIG. 10 is a flow chart illustrating an embodiment of a method for repairing hard and soft failures in an SRAM array using selective circuit assists. During step 1002, an SRAM array is tested to determine locations of memory cells with hard failures. The SRAM array may be contained in a stand-alone SRAM or in an SRAM that is part of an SOC, a DSP, or a processor. After the location of the soft failures is determined, the memory cells with hard failures are replaced with redundant memory cells, step 1004.

During step 1006, the SRAM array is tested to determine locations of memory cells with soft failures. After the locations of the soft failures are determined, the type of SRAM soft failure is determined in step 1008. The type of SRAM soft failure may be a failure that occurs during a write of a memory cell or during the read of a memory cell for example.

After the type of SRAM soft failure has been determined, one or more assist circuits may be activated that change a voltage in the memory cells with the soft failures, step 1010. The voltage is changed for a group of memory cells. For example, the group of memory cells may be a group of memory cells that are contained on an individual word line or an individual bit line pair. A voltage is changed with respect to another voltage. For example, the voltage on an individual word line may increase or decrease with respect to the positive power supply voltage VDD in a memory cell depending on the type of soft failure.

After an assist circuit has been activated to fix a particular group of soft failures, it is determined in step 1012 whether there are more groups with soft failures. When there are more groups with soft failures, step 1010 is repeated and another assist circuit is activated. However, when there are no longer groups with soft failures, the SRAM array may be operated as a functional SRAM array.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of repairing soft failures in memory cells of an SRAM array comprising:
    testing the SRAM array to determine locations where the memory cells have soft failures;
    testing the SRAM array to determine types of soft failures in the memory cells with soft failures;
    activating at least one assist circuit;
    wherein the at least one assist circuit changes a voltage in the memory cells with soft failures that have one and only one type of soft failure;
    wherein the changed voltage is used during normal operation of the SRAM array;
    wherein the memory cells with soft failures that have one and only one type of soft failure are contained in a group.

2. The method of claim 1 wherein a type of soft failure is a write failure.

3. The method of claim 2 wherein the write failure occurs while attempting to write a logical one to the memory cells.

4. The method of claim 3 wherein the group is a word line.

5. The method of claim 4 wherein a voltage on the word line is increased with respect to VDD of the memory cells during writing of the memory cells.

6. The method of claim 3 wherein the group is bit line pair.

7. The method of claim 6 wherein a voltage on VDD of the memory cells is decreased with respect to a voltage of a word line of the memory cells.

8. The method of claim 6 wherein a voltage on a bit line from the bit line pair is decreased with respect to VSS of the memory cells.

9. The method of claim 1 wherein the type of soft failure is a read failure.

10. The method of claim 9 wherein the read failure occurs while attempting to read a logical zero from the memory cells.

11. The method of claim 10 wherein the group is bit line pair.

12. The method of claim 11 wherein VDD of the memory is increased with respect to a voltage on the word line of the memory cells during reading of the memory cells.

13. The method of claim 12 wherein VDD of the memory is increased with respect to a voltage on the word line of the memory cells during reading of the memory cells using capacitive coupling.

14. The method of claim 10 wherein the group is a word line.

15. The method of claim 14 wherein a voltage on the word line is decreased with respect to VDD of the memory cells during reading of the memory cells.

16. A method of repairing bit failures in memory cells of an SRAM array comprising:
    testing the SRAM array to determine locations of the memory cells with hard bit failures;

replacing the memory cells with hard bit failures with redundant memory cells;

testing the SRAM array to determine locations of the memory cells with soft failures;

testing the SRAM array to determine types of soft failure in the memory cells with soft failures;

activating an assist circuit;

wherein the assist circuit changes a voltage in the memory cells with soft failures that have one and only one type of soft failure;

wherein the changed voltage is used during normal operation of the SRAM array;

wherein the memory cells with soft failures that have one and only one type of soft failure are contained in a group.

17. The method of claim 16 wherein the SRAM array is on a stand-alone SRAM memory integrated circuit.

18. The method of claim 16 wherein the SRAM array is part of an SRAM wherein the SRAM is included on a system on a chip (SOC).

19. The method of claim 16 wherein replacing the memory cells with hard bit failures with redundant memory cells includes blowing fuses.

20. The method of claim 16 wherein activating an assist circuit includes electrically selecting the assist circuit.

* * * * *